(12) United States Patent
Rodder

(10) Patent No.: US 6,246,091 B1
(45) Date of Patent: Jun. 12, 2001

(54) LATERAL MOSFET HAVING A BARRIER BETWEEN THE SOURCE/DRAIN REGIONS AND THE CHANNEL

(75) Inventor: Mark S. Rodder, University Park, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/335,242

(22) Filed: Jun. 17, 1999

Related U.S. Application Data

(62) Division of application No. 09/205,346, filed on Dec. 3, 1998, now Pat. No. 6,127,233.

(51) Int. Cl.[7] ................................................. H01L 29/76
(52) U.S. Cl. ........................... 257/335; 257/339; 257/345
(58) Field of Search ............................. 438/300; 257/345, 257/339, 335, 343

(56) References Cited

U.S. PATENT DOCUMENTS

| 5,012,306 | * | 4/1991 | Tasch, Jr. et al. | .................... 257/345 |
| 5,371,394 | * | 12/1994 | Ma et al. | ............................. 257/335 |
| 5,793,088 | * | 8/1998 | Choi et al. | ........................... 257/408 |
| 6,051,473 | * | 4/2000 | Ishida et al. | ......................... 438/300 |

OTHER PUBLICATIONS

Tasch et al., "A New Structural Approach for Reducing Hot Carrier Generation in Deep Submicron MOSFETs," 1990 Symposium on VLSI Technology, pp. 43–44, 1990.
Rodder et al., "Raised Source/Drain MOSFET with Dual Sidewall Spacers," IEEE Electron Device Letters, vol. 12, No. 3, Mar. 1991, pp. 89–91.

* cited by examiner

Primary Examiner—Minh Loan Tran
(74) Attorney, Agent, or Firm—Jacqueline J. Garner; W. James Brady III; Frederick J. Telecky, Jr.

(57) ABSTRACT

A lateral MOSFET (100) and a method for making the same. A two layer raised source/drain region (106) is located adjacent a gate structure (112). The first layer (106a) of the raised source drain is initially doped p-type and the second layer (106b) of the raised source/drain region is doped n-type. P-type dopants from first layer (106a) are diffused into the substrate to form a pocket barrier region (105). N-type dopants from second layer (106b) diffuse into first layer (106a) so that it becomes n-type and into the substrate to form source/drain junction regions (104). P-type pocket barrier region (105) thus provides a barrier between the source/drain junction regions (104) and the channel region (108).

9 Claims, 3 Drawing Sheets

LATERAL MOSFET HAVING A BARRIER BETWEEN THE SOURCE/DRAIN REGIONS AND THE CHANNEL

CROSS-REFERENCE TO RELATED APPLICATIONS

This application is a divisional of prior application 09/205,346, filed on Dec. 3, 1998, now U.S. Pat. No. 6,127,233.

The following co-assigned, co-pending patent applications are related to the invention and are hereby incorporated by reference:

| Ser. No. | Filed | Inventors |
|---|---|---|
| (TI-22027) | | Rodder et al. |
| (TI-22748) | | Rodder et al. |
| (TI-24164) | | Rodder |

FIELD OF THE INVENTION

This invention generally relates to semiconductor devices and processes and more specifically to a lateral MOSFET structures having raised source/drain regions.

BACKGROUND OF THE INVENTION

As semiconductor devices are scaled to smaller dimensions, generally in the sub-0.1 $\mu$m region, it is highly desirable and generally necessary to fabricate such devices with smaller junction depths and a controllable pocket implant adjacent to the shallow junctions to reduce short-channel effects (i.e., reduced threshold voltage rolloff) and reduced in gate length. The pocket implant is a doped implanted region which is oppositely doped to the junction regions. A problem that arises with such small geometries is that, with very short channel lengths, the implant profile cannot be adequately controlled and shallow junctions and/or well controlled thicknesses of doped layers generally cannot be formed by simple implantation.

An example of such a prior art device is shown in FIGS. 1a and 1b wherein there is shown a semiconductor substrate 1, for example doped p-type, having a gate electrode 3 spaced from the substrate by a dielectric layer 5. Shallow doped extension regions 7 (denoted herein as drain extension regions and, for example, doped n-type) may be formed on each side of the gate electrode 3 with or without sidewall dielectric spacers 2 provided adjacent to the gate electrode 3 prior to formation of the doped extension regions 7. Pocket regions 9 of doping type opposite (e.g., p-type) to that of the drain extension regions 7 may be formed by means of implantation prior to or after formation of the drain extension regions 7. Typically, the pocket region 9 extends beyond the drain extension regions 7 in both the lateral and vertical directions, whereby a large bottomwall capacitance can result due to the n/p junction region formed at the bottom of the drain extension region due to the overlap with the pocket region 9 over the entire active area. The doping in the pocket region 9 from the pocket process may be of higher concentration than the doping of the substrate 1.

To reduce this bottomwall capacitance over the entire active area, a deeper source/drain region 10 (in this example, n-type) can be formed after formation of sidewall spacers 12 so that the bottomwall overlap of the deeper source/drain region 10 and the pocket regions 9 is eliminated, thus reducing the bottomwall capacitance in these regions as shown in FIG. 1b.

When dealing with sub-0.1 $\mu$m geometries, the gate width dimensions are in the 200 to 900 angstrom region, thereby leaving a channel region on the order of about 100–800 angstroms. Implants cannot be adequately controlled in accordance with the prior art semiconductor fabrication techniques when such small dimensions are involved.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

The invention will now be described in conjunction with a raised source/drain n-type MOSFET for the deep submicron regime (i.e., tenth-micron and below). Those of ordinary skill in the art will realize that the benefits of the invention are also applicable to other MOSFET structures and that the benefits are not limited to the deep sub-micron regime.

Figure 1A:
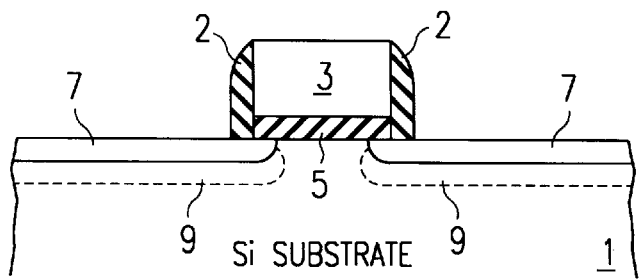
FIGS. 1a–1b cross-sectional diagrams of a prior art MOSFET structure.
Figure 1B:
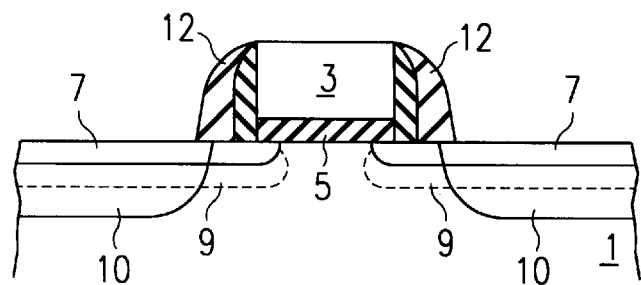
Figure 2:
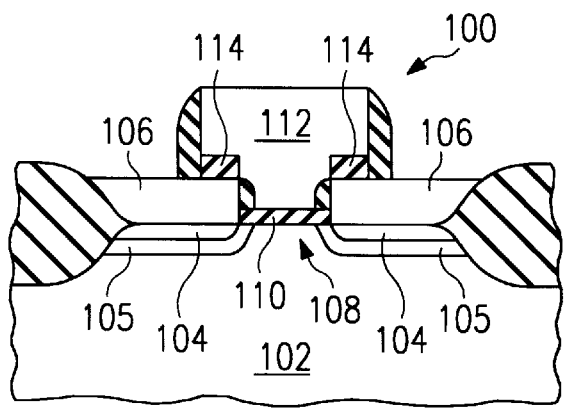
FIG. 2 cross-sectional diagram of a MOSFET forming according to a first embodiment of the invention.

A raised source/drain MOSFET 100 formed according to a first embodiment of the invention is shown in FIG. 2. MOSFET 100 is formed in substrate 102 and may comprise ultra-shallow n-type source/drain junction regions 104 below raised source/drain regions 106. Surrounding n-type source/drain junction regions 104 in substrate 102 may be a p-type barrier region 105. P-type barrier regions 105 provide a barrier between source drain regions 104 and channel region 108. Optionally, regions 104 and 105 may not be diffused into the substrate. This provides an ultimate zero junction depth in the substrate. Because gate 112 is adjacent raised source/drain regions 106, the device can operate even when regions 104 and 105 are not formed. Raised source/drain regions 106 are, for example, doped epitaxial silicon. However, other materials such as other semiconductors may alternatively be used.

Channel doping may be substantially limited by means of self-alignment to the immediate channel region 108. This reduces the source/drain junction capacitance over the traditional methods of (a) implanting the entire active area for the channel implant including the source/drain junction regions, or (b) using non-self-aligned but more localized channel implant.

A gate dielectric 110 separates the gate electrode 112 from the channel region 108 and raised source/drain regions 106. Gate dielectric 110 may comprise any appropriate material.

Conventionally, a thermally grown oxide, oxynitride, or deposited gate insulator is used. Gate electrode 112 preferably comprises a low resistance material such as metal or doped polysilicon. However, other conductive materials, such as amorphous silicon, a non-crystalline silicon, a composite metal-polysilicon or metal-metal, may alternatively be used. Examples include aluminum over titanium-nitride and tungsten over titanium nitride. Gate electrode 112 is also preferably salicided to further reduce sheet resistance if polysilicon is used. If desired, gate electrode 112 may be formed into a T-gate structure as shown in FIG. 2. A T-gate structure is not required to practice the invention, but offers further reduction in gate sheet resistance.

An insulator layer 114 separates the raised source/drain regions 106 from the overlying portions of the T-gate structure 112. The material of insulator layer 114 is chosen such that a disposable gate material used during processing may be etched selectively with respect to dielectric layer 114. This will be described further below. For example, insulator layer 114 may comprise an oxide. The thickness of insulator layer 114 may be tailored to allow for a low gate-to-drain capacitance between the raised source/drain regions 106 and the overlying portion of the T-gate structure 112.

Figure 3A:
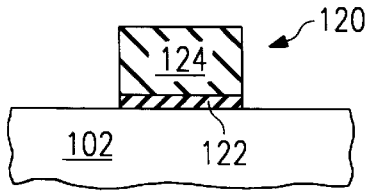
FIGS. 3A–3H cross-sectional diagrams of the MOSFET of FIG. 2 during various stages of fabrication.

A method for forming MOSFET 100 according to the first embodiment of the invention will now be described in conjunction with FIGS. 3A–3H. Referring to FIG. 3A, a disposable gate 120 is formed on an active area of substrate 102 over the region where the channel region of MOSFET 100 is desired. Several disposable gate processes are known in the art. An exemplary disposable gate process is discussed herein. Disposable gate 120 comprises two materials, first material 122 and second material 124. The first and second materials 122 and 124 are chosen so that they may be selectively etched with respect to each other. For example, they may comprise oxide and nitride respectively. The first material is also chosen so that it may be etched very selectively with respect to silicon to avoid damaging the channel region upon its removal. To form disposable gate 120, the first material 122 is deposited over substrate 102. The second material 124 is then deposited over the first material 122. Both materials (122,124) are then patterned and etched leaving the structure shown in FIG. 3A.

Figure 3B:
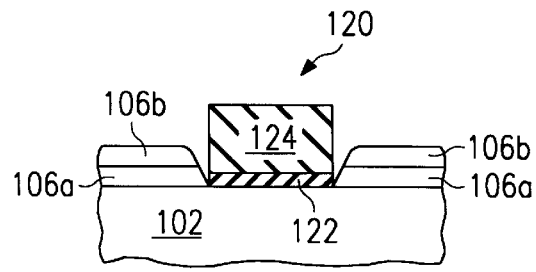

Next, raised source/drain regions 106 may be formed. A p-type epitaxial layer 106a is selectively formed over substrate 102 adjacent disposable gate 120, as shown in FIG. 3B. A n-type epitaxial layer 106b is then selectively formed over p-type epitaxial layer 106a. Disposable gate 120 is used as a masking layer for the epitaxial process. Thus, raised source/drain regions 106 are self-aligned to disposable gate 120. Angled faceting of the epitaxially formed raised source/drain region 106 at the edge of the disposable gate 120 may occur. The degree of faceting may be partially controlled by adjusting process parameters of the cleaning and deposition processes.

Preferably, raised source/drain regions 106a, 106b are doped in situ by appropriate means of deposition and masking, but a portion of the raised source/drain regions 106 may additionally be doped after deposition by means such as implant as described later. The p-type doping in p-type epitaxial layer 106a will ultimately be used to form a pocket barrier to reduce leakage.

If desired, a selected portion of the n-type epitaxial layer 106b may be cladded after formation. The cladding forms a low resistance material over the raised source/drain regions by means of e.g., salicidation or formation of a metal layer over a portion of the raised source/drain regions 106. Cladding prior to the formation of the gate dielectric and gate electrode may reduce the heat treatments seen by the gate dielectric and gate electrode.

Figure 3C:
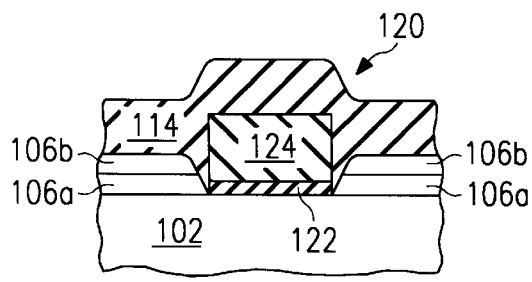
Figure 3D:
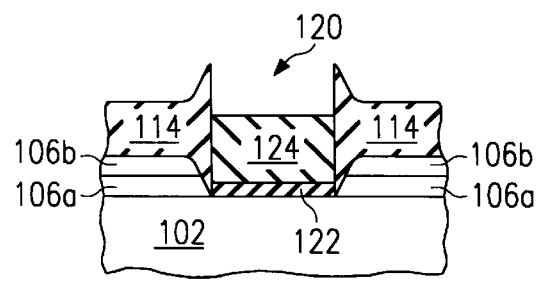

Referring to FIG. 3C, an insulator material 114 is deposited over the structure. Insulator material 114 is chosen such that it may be etched selectively with respect to the second material 124 of disposable electrode 120. For example, if the second material 124 is nitride, insulator material 114 may comprise an oxide. Insulator material 114 is then removed to expose disposable gate 120, as shown in FIG. 3D. For example, an etch-back process or chemical-mechanical polishing (CMP) may be used. Alternatively, a patterned etch of insulator material 114 in the proximity of the disposable gate 120 may be used. Insulator layer 114 covers raised source/drain regions 106, but not the surface of disposable gate 120.

Figure 3E:
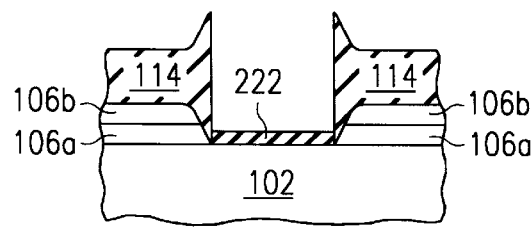

Next, the second material 124 of disposable gate 120 is selectively removed, as shown in FIG. 3E. Because the composition of first material 122, second material 124 and insulator material 114 are chosen such that second material 124 may be selectively etched with respect to both insulator material 114 and first material 122, insulator layer 114 and first material 122 are not appreciably removed during the removal of second material 124. After the removal of second material 124, first material 122 is removed. Again, due to the judicious choice of materials and/or etch processes, first material 122 is removed without etching into the substrate 102. Severe damage to the channel region 108 of substrate 102 is thereby avoided.

Figure 3F:
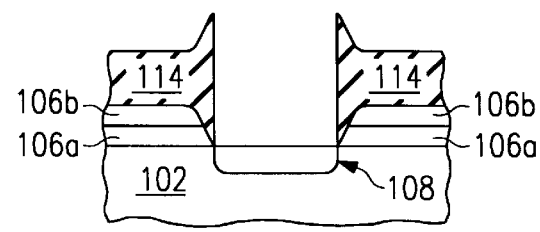

Referring to FIG. 3F, introduction of channel dopants (e.g., by means such as a channel (or Vt) implant or gas immersion laser doping) is performed either before or after the removal of first material 122. Because insulator layer 114 covers raised source/drain regions 106, the introduction of channel dopants is substantially limited to only the immediate channel 108 area. The introduction of channel dopants is self-aligned to the raised source/drain regions 106. This prevents an increase in the capacitance of the subsequently formed source/drain junction region over prior art methods in which the channel implant is not self-aligned to the channel but extends into the source/drain junction regions as well.

Figure 3G:
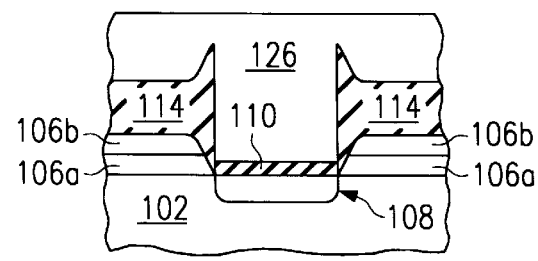
Figure 4:
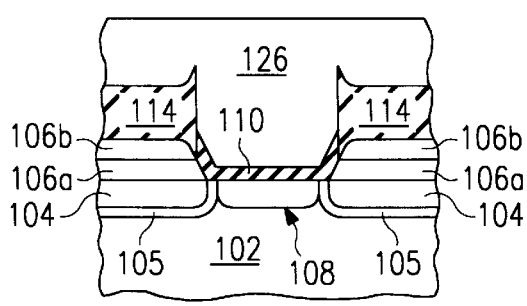
FIG. 4 is a cross-sectional diagram of an alternative embodiment for the MOSFET of FIG. 2 during fabrication.

Next, a gate dielectric 110 is formed followed by the deposition of gate material 126, as shown in FIG. 3G. Gate dielectric 110 may comprise a grown and/or deposited oxide, oxynitride, or any other suitable gate dielectric material including materials with higher dielectric constant than silicon dioxide. If gate dielectric 110 is deposited, then it may be nearly conformal along the vertical edges of insulator 114 as well as on top of insulator layer 114 (not shown). The lateral dimension of the gate material 126 adjacent to the gate dielectric 110 is determined by the opening in insulator material 114 left by the removal of the disposable gate 120. Thus, the actual channel length is not determined by the patterned etch of the gate material 126. The opening left by the removal of disposable gate 120 may be such that the gate dielectric 110 and gate material 126 do or do not extend directly over a portion of the raised source/drain regions 106 and/or doped source/drain regions 104. (Note: in this embodiment, regions 104 are not yet formed.) FIG. 3G shows the case where the gate dielectric 110/gate material 126 do not extend directly over regions 106 within the space left by the removal of the disposable gate 120. For the case where the gate dielectric 110/gate material 126 do extend over the facets and/or over the edges of region 106, the gate dielectric 110 in part separates the gate material 126 from the source/drain regions 106 and/or 104, as shown in FIG. 4. Extension of the gate material 126 over regions 106 and/or 104 may be beneficial in reducing series resistance of the subsequently formed MOSFET although an increase in gate-to-drain capacitance will additionally result. The existence and/or optimization of the extension of gate material 126 depends on the application and trade-offs between such issues as the before mentioned series resistance and overlap capacitance.

Gate material 126 may comprise a non-crystalline material substantially containing silicon or silicon-germanium, a doped polysilicon layer, a doped amorphous silicon layer, a metal layer, a composite material comprised of different metals or a combination of metal and semiconductor material, or other appropriate conductive materials (e.g., materials including tungsten, titanium nitride, aluminum, or copper). Additionally, it is noted that if a semiconductor material is utilized in part for the gate material 126, this semiconductor material can be doped in-situ or doped after deposition by means such as implantation and anneal. Doping can be by introduction of n-type dopants (e.g., phosphorus, arsenic or antimony) for an n-type gate material or by p-type dopants (e.g., boron) for a p-type gate material.

Figure 3H:
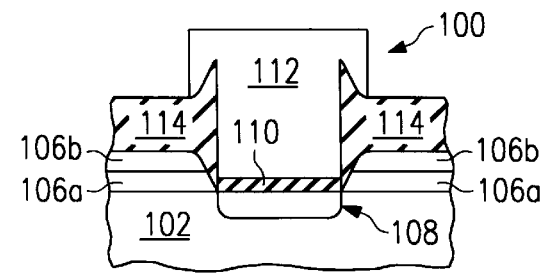

Gate material 126 may then be patterned and etched to form gate electrode 112, as shown in FIG. 3H. By performing the gate processing after source/drain formation, heat treatments required by source/drain formation do not affect the gate dielectric 110 and gate electrode 112. Thus, a doped polysilicon gate electrode can be used with an ultra-thin gate dielectric (i.e., 60 Å or even less than 30 Å) without having dopant diffuse from the doped polysilicon into the gate dielectric and channel region. Alternatively, a gate electrode comprising, in part, a metal can be used because the heat treatments for the source/drain formation have already been performed.

If desired, a T-gate structure in which the gate electrode extends over a portion of insulator layer 114 may be used to further reduce the gate sheet resistance, as shown in FIG. 3H. In addition, having insulator layer 114 separate the raised source/drain regions 106 from the overlying portions of T-gate structure 112 results in a low gate-to-drain capacitance between raised source/drain regions 106 and the overlying portions of T-gate structure 112. Although it offers some advantages, a T-gate structure is not required to practice the invention.

Figure 5:
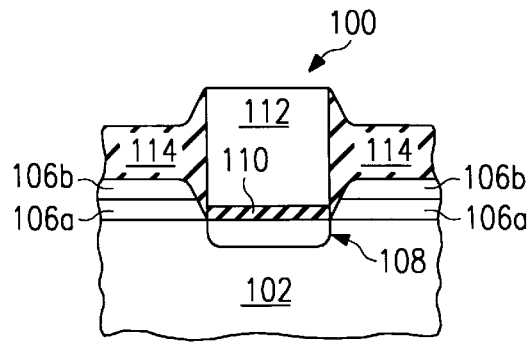
FIG. 5 is a cross-sectional diagram of an alternative embodiment for the MOSFET of FIG. 2 during fabrication.

There are several methods that may be used to form gate electrode 112. As a first example, after deposition, the gate material 126 can be planarized back so that it is substantially even with insulator layer 114 to form a self-aligned non-T-gate structure, as shown in FIG. 5. Subsequently, if desired, a T-gate structure may be formed by means such as a selective epitaxy of semiconductor or metal with the epitaxial overgrowth resulting in a T-gate structure. As a second example, the deposited gate material 126 may simply be patterned and etched to form a T-gate structure extending over a portion of insulator layer 114. In addition, the gate electrode 112 may be cladded by a lower resistance material if desired. Cladding may be accomplished in a number of ways including salicidation, epitaxy of, for example, a metal, or deposition, pattern and etch of a low resistance material.

In a third example, after the gate material 126 is deposited, but before it is etched, a cladding material may be deposited. Then, the cladding material and gate material may be patterned and etched to form a T-gate structure electrode 112. In this case, both the gate material 126 and cladding material of electrode 112 extend over the insulating layer 114.

In a fourth example, a non-T-gate structure may be formed as described above. Subsequently, cladding may be accomplished by depositing a low resistance material (e.g. silicide or metal) and patterning and etching the cladding material such that it extends over a portion of insulator layer 114. In this case, the gate electrode 112 comprises a T-gate structure in which only the cladding layer extends over insulating layer 114.

Finally, the structure may be annealed at this point to activate dopants in the raised source/drain regions 106a and 106b. If desired, the anneal may also be used to diffuse dopants. P-type dopant from epitaxial layer 106a may be diffused into substrate 102 to form pocket barrier regions 105. N-type dopant from epitaxial layer 106b diffuses through epitaxial layer 106a, changing its conductivity to n-type, and possibly into the substrate 102 to form source/drain junction regions 104. However, it should be noted that adequate activation/diffusion can be obtained during the deposition of the raised source/drain if the deposition time or temperature is sufficient. The anneal may also be performed earlier in the process if desired or it may be part of another process such as the formation of a gate dielectric. Diffusing the dopant from a raised source/drain structure allows for shallower source/drain junction regions 104 than are possible with an implant doped source/drain junction region. However, formation of regions 104 and 105 is not necessary to practice the invention. Instead, the dopants may remain in region 106 for zero junction depth, if desired.

Subsequent the process flow described above, conventional processes may be used to form connections from the gate electrode 112 and source/drain regions 106 or 104 to other devices (not shown). Various modifications to the process described above will be apparent to persons skilled in the art upon reference to the description. Several modifications for forming source/drain regions for MOSFET 100 will now be discussed.

In one modification, instead of epitaxially forming raised source/drain regions 106, the raised source/drain regions 106 may be formed by other methods. For example, they may be formed by a non-selective deposition of the desired conductive material followed by pattern and etch of this material. In addition, raised source/drain regions may comprise a material different from the substrate material. Exemplary materials include semiconductors, semiconductor compounds (e.g., SiC, SiGe, etc.), or combinations thereof.

Figure 6A:
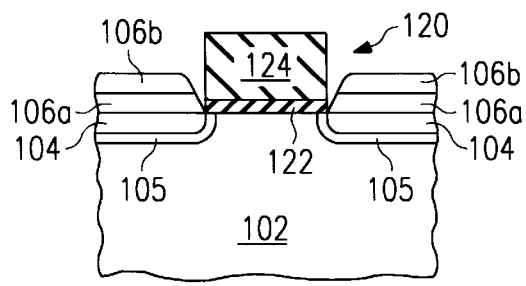
FIGS. 6A–6C are cross-sectional diagrams of an alternative embodiment for the MOSFET of FIG. 2 during fabrication.
Figure 6B:
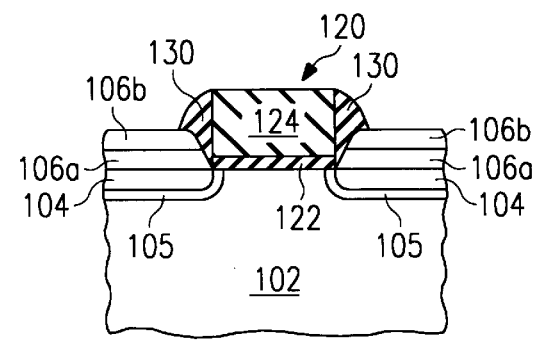
Figure 6C:
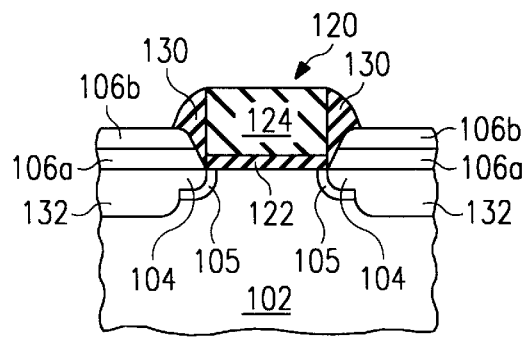

In another modification, deep source/drain regions 132 are utilized. The raised source/drain regions 106 are annealed prior to removing the disposable gate 120 and, if desired, form source/drain regions 104 and pocket barrier region 105, as shown in FIG. 6a. A sidewall spacer 130 is formed on the sidewalls of disposable gate 120 over the facets of raised source/drain regions 106, as shown in FIG. 6b. After the formation of sidewall spacer 130, deeper source/drain region 132 are formed by, for example, means such as implantation and anneal, as shown in FIG. 6c. Sidewall spacers 130 serve to space the deeper source/drain regions 132 from the subsequently formed gate electrode 112. It should be noted that the anneal to form source/drain regions 104 and/or activate dopants in region 106 may be part of the sidewall spacer 130 formation or the anneal to form the deeper source/drain regions 132 instead of being a separate anneal.

The above mentioned sidewall spacer 130 has several other uses that may be utilized alone or in addition to that described above. Sidewall spacers 130 will then prevent the implantation of dopant into the facets of raised source/drain regions 106. Sidewall spacers 130 can also be used in a process for cladding the raised source/drain regions 106, thereby preventing the cladding in a selected portion of the raised source/drain regions 106. This selected portion may include some, all or more of regions 106 than simply the faceted area. Cladding of the raised source/drain regions 106 can be accomplished using methods similar to those described above with reference to cladding the gate electrode 112. Cladding of the raised source/drain regions 104 should not, however, occur over the entire region 106. Cladding at the ends of the faceted regions should be avoided since a gate dielectric is desired at that region and a thermally grown gate dielectric would not form over a cladded region, and the cladding must not short out the n+/p layers in regions 106 adjacent (or nearly adjacent) the gate electrode 112 (subsequently formed).

It should be noted that a disposable gate process is not necessary to practice the invention. A conventional gate structure may also be used. After isolation structures are formed, a gate dielectric is formed over the substrate and a gate electrode material is deposited over the gate dielectric. The gate dielectric and gate electrode material are patterned and etched to form the gate structure as shown in FIG. 6a. Sidewall spacers are then formed on the sidewalls of the gate structure. Raised source/drain regions 106 are then formed as described above and annealed to activate dopants and, if desired, form the source/drain junction regions 104 and pocket barrier regions 105, as shown in FIG. 6b.

Those of ordinary skill in the art will realize that many of the options described above may also be used in conjunction with the conventional gate structure. For example, optional deep source/drain regions may be formed and/or cladding of the gate electrode material and raised source/drain regions 106 may be accomplished.

While this invention has been described with reference to illustrative embodiments, this description is not intended to be construed in a limiting sense. Various modifications and combinations of the illustrative embodiments, as well as other embodiments of the invention, such as reversing the conductivity types from n/p to p/n account for CMOS applications, will be apparent to persons skilled in the art upon reference to the description. It is therefore intended that the appended claims encompass any such modifications or embodiments.

What is claimed is:

1. A lateral MOSFET comprising:

a first epitaxial layer of a first conductivity type located over a substrate;

a raised source/drain region comprising a second epitaxial layer of a second conductivity type located over said first epitaxial layer;

a gate dielectric located laterally adjacent the first epitaxial layer and over a channel region of said substrate; and a gate electrode located adjacent the gate dielectric and over said channel region.

2. The lateral MOSFET of claim 1, wherein said raised source/drain region comprises silicon.

3. The lateral MOSFET of claim 1, wherein said raised source/drain region comprise a different material composition than the substrate.

4. The lateral MOSFET of claim 1, wherein said gate electrode and gate dielectric are adjacent to a portion of said raised source/drain region, wherein said gate dielectric separates said gate electrode from said raised source/drain region.

5. The lateral MOSFET of claim 1, wherein said first conductivity type is p-type and the second conductivity type is n-type.

6. The lateral MOSFET of claim 1, wherein the second epitaxial layer comprises SiC.

7. The lateral MOSFET of claim 1, wherein the second epitaxial layer comprises SiGe.

8. The lateral MOSFET of claim 1, wherein the first epitaxial layer comprises SiC.

9. The lateral MOSFET of claim 1, wherein the first epitaxial layer comprises SiGe.

* * * * *